(12) United States Patent
Park et al.

(10) Patent No.: US 6,826,080 B2
(45) Date of Patent: Nov. 30, 2004

(54) VIRTUAL GROUND NONVOLATILE SEMICONDUCTOR MEMORY ARRAY ARCHITECTURE AND INTEGRATED CIRCUIT STRUCTURE THEREFOR

(75) Inventors: Joo Weon Park, Pleasanton, CA (US); Kyung Joon Han, Palo Alto, CA (US); Gyu-Wan Kwon, Cupertino, CA (US); Jong Seuk Lee, Palo Alto, CA (US)

(73) Assignee: NexFlash Technologies, Inc., San Jose, CA (US)

( * ) Notice: Subject to any disclaimer, the term of this patent is extended or adjusted under 35 U.S.C. 154(b) by 200 days.

(21) Appl. No.: 10/154,979

(22) Filed: May 24, 2002

(65) Prior Publication Data

US 2003/0218908 A1 Nov. 27, 2003

(51) Int. Cl.[7] .......................... G11C 16/04; G11C 16/06
(52) U.S. Cl. .............................. 365/185.05; 365/185.11; 365/185.16; 365/185.33
(58) Field of Search ....................... 365/185.05, 185.11, 365/185.16, 185.33

(56) References Cited

U.S. PATENT DOCUMENTS

| | | | |
|---|---|---|---|
| 5,060,195 A | | 10/1991 | Gill et al. |
| 5,418,741 A | | 5/1995 | Gill |
| 5,526,307 A | * | 6/1996 | Yiu et al. ............... 365/185.16 |
| 5,623,443 A | * | 4/1997 | Kazerounian et al. . 365/185.16 |
| 5,646,886 A | | 7/1997 | Brahmbhatt |
| 5,659,504 A | | 8/1997 | Bude et al. |
| 5,959,892 A | | 9/1999 | Lin et al. |
| 6,175,519 B1 | | 1/2001 | Lu et al. |
| 6,570,810 B2 | * | 5/2003 | Wong .................... 365/185.11 |
| 2001/0050861 A1 | | 12/2001 | Yamauchi et al. |
| 2002/0012280 A1 | | 1/2002 | Yamamoto et al. |
| 2002/0041526 A1 | | 4/2002 | Sugita et al. |

OTHER PUBLICATIONS

Brown, William D. and Brewer, Joe E., eds., Nonvolatile Semiconductor Memory Technology: A Comprehensive Guide to Understanding and Using NVSM Devices, IEEE Press, New York, 1998, pp. 69, 105, 107–108, 203, 213–217, 226–227, 235, 239–241, 244, 247, 279–281.
U.S. patent application Ser. No. 10/035,414, Hsia et al., filed Nov. 8, 2001.
U.S. patent application Ser. No. 10/039,518, Han et al., filed Nov. 8, 2001.

* cited by examiner

*Primary Examiner*—Trong Phan
(74) *Attorney, Agent, or Firm*—Altera Law Group, LLC

(57) ABSTRACT

In nonvolatile memory cell array, the memory cells of each sector are organized into groups of successive cells, the groups preferably being of the same size and preferably isolated from one another in both the row and column directions by a suitable isolation structure such as field dielectric or trench dielectric. Because of cell group isolation, each group of column lines may be decoded by its own relatively small program column select, which preferably is replicated in essentially identical form for all groups of column lines. While each program column select preferably is used to decode one group of column lines, larger program column selects may be used if desired to decode two or more groups of column lines. Read column selects may decode one or more groups of column lines as desired. The number of column lines decoded may the same as or different than the number of column lines decoded.

19 Claims, 12 Drawing Sheets

| CELL # | YSAR | | | | | | | | | | | | | | | | | YSSA | | | |
|---|---|---|---|---|---|---|---|---|---|---|---|---|---|---|---|---|---|---|---|---|---|
| | 0 | 1 | 2 | 3 | 4 | 5 | 6 | 7 | 8 | 9 | 10 | 11 | 12 | 13 | 14 | 15 | 16 | 0 | 1 | 2 | 3 |
| 0 | 1 | 1 | 1 | 1 | | | | | | | | | | | | | | 1 | | | |
| 1 | | 1 | 1 | 1 | 1 | | | | | | | | | | | | | | 1 | | |
| 2 | | | 1 | 1 | 1 | 1 | | | | | | | | | | | | | | 1 | |
| 3 | | | | 1 | 1 | 1 | 1 | | | | | | | | | | | | | | 1 |
| 4 | | | | | 1 | 1 | 1 | 1 | | | | | | | | | | 1 | | | |
| 5 | | | | | | 1 | 1 | 1 | 1 | | | | | | | | | | 1 | | |
| 6 | | | | | | | 1 | 1 | 1 | 1 | | | | | | | | | | 1 | |
| 7 | | | | | | | | 1 | 1 | 1 | 1 | | | | | | | | | | 1 |
| 8 | | | | | | | | | 1 | 1 | 1 | 1 | | | | | | 1 | | | |
| 9 | | | | | | | | | | 1 | 1 | 1 | 1 | | | | | | 1 | | |
| 10 | | | | | | | | | | | 1 | 1 | 1 | 1 | | | | | | 1 | |
| 11 | | | | | | | | | | | | 1 | 1 | 1 | 1 | | | | | | 1 |
| 12 | | | | | | | | | | | | | 1 | 1 | 1 | 1 | | 1 | | | |
| 13 | | | | | | | | | | | | | | 1 | 1 | 1 | 1 | 1 | | | |
| 14 | | | | | | | | | | | | | | | 1 | 1 | 1 | | 1 | | |
| 15 | | | | | | | | | | | | | | | | 1 | 1 | | | | 1 |

| CELL # | BL | | | | | | | | | | | | | | | | |
|---|---|---|---|---|---|---|---|---|---|---|---|---|---|---|---|---|---|
| | 0 | 1 | 2 | 3 | 4 | 5 | 6 | 7 | 8 | 9 | 10 | 11 | 12 | 13 | 14 | 15 | 16 |
| 0 | 0 | 1 | 1 | 0 | | | | | | | | | | | | | |
| 1 | | 0 | 1 | 1 | 0 | | | | | | | | | | | | |
| 2 | | | 0 | 1 | 1 | 0 | | | | | | | | | | | |
| 3 | | | | 0 | 1 | 1 | 0 | | | | | | | | | | |
| 4 | | | | | 0 | 1 | 1 | 0 | | | | | | | | | |
| 5 | | | | | | 0 | 1 | 1 | 0 | | | | | | | | |
| 6 | | | | | | | 0 | 1 | 1 | 0 | | | | | | | |
| 7 | | | | | | | | 0 | 1 | 1 | 0 | | | | | | |
| 8 | | | | | | | | | 0 | 1 | 1 | 0 | | | | | |
| 9 | | | | | | | | | | 0 | 1 | 1 | 0 | | | | |
| 10 | | | | | | | | | | | 0 | 1 | 1 | 0 | | | |
| 11 | | | | | | | | | | | | 0 | 1 | 1 | 0 | | |
| 12 | | | | | | | | | | | | | 0 | 1 | 1 | 0 | |
| 13 | | | | | | | | | | | | | | 0 | 1 | 1 | 0 |
| 14 | | | | | | | | | | | | | | | 0 | 1 | 1 |
| 15 | | | | | | | | | | | | | | | | 0 | 1 |

FIG. 12

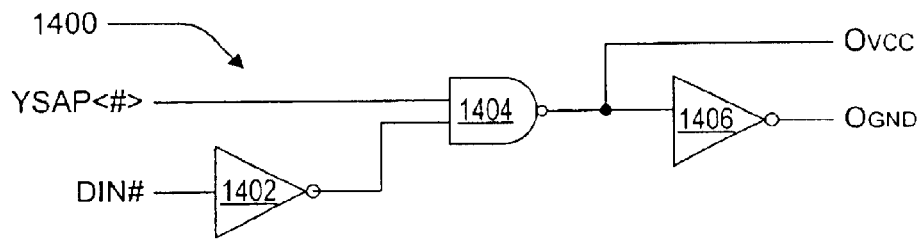
FIG. 14
| DIN | YSAP | OVCC | OGND | RESULT |
|---|---|---|---|---|
| 0 | 0 | 1 | 0 | NO PROGRAMMING |
| 0 | 1 | 0 | 1 | PROGRAM |
| 1 | 1 | 1 | 0 | NO PROGRAMMING |
| 1 | 0 | 1 | 0 | NO PROGRAMMING |
FIG. 15
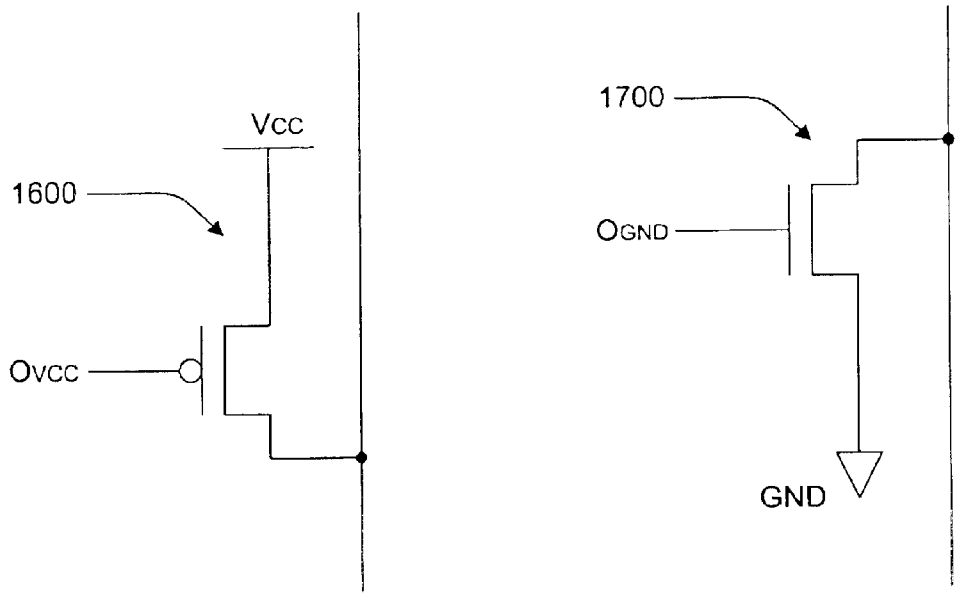
FIG. 16  FIG. 17

VIRTUAL GROUND NONVOLATILE SEMICONDUCTOR MEMORY ARRAY ARCHITECTURE AND INTEGRATED CIRCUIT STRUCTURE THEREFOR

BACKGROUND OF THE INVENTION

1. Field of the Invention

The present invention relates to semiconductor memory, and more particularly to a nonvolatile virtual ground memory array and method of operation thereof to avoid cell disturb.

2. Description of the Related Art

Nonvolatile memory retains stored data when power is removed, which is required or at least highly desirable in many different types of computers and other electronic devices. Nonvolatile semiconductor memory devices are generally divided into two main classes. The first class is based on the storage of charge in discrete trapping centers of a dielectric layer of the structure. The second class is based on the storage of charge on a conducting or semiconducting layer that is completely surrounded by a dielectric, typically an oxide.

A common type of stored charge device is the stacked gate transistor, also known as a floating gate transistor, in which cell programming is performed through channel hot-electron injection ("CHE"). An illustrative self-aligned double-polysilicon stacked gate structure 1 is shown in FIG. 1. A floating gate 14, typically a doped polysilicon layer, is sandwiched between two insulator layers 12 and 16, typically oxide. The top layer of the stack is a control gate electrode 10, typically a doped polysilicon layer, to which a control gate voltage $V_G$ may be applied. The stacked gate structure is shown symmetrically overlying a heavily doped n+ source region 20 and a heavily doped n+ drain region 22, to which a source voltage $V_S$ and a drain voltage $V_D$ respectively may be applied, as well as a channel region between the source region 20 and the drain region 22. The channel region is part of a p-well 28, which also contains the source region 20, the drain region 22, and a heavily p+ doped contact region 24 to which a p-well bias voltage $P_D$ may be applied. The p-well 28 is contained within an n-well 30, which also contains a heavily n+ doped contact region 26 to which an n-well bias voltage $V_N$ may be applied. The n-well 30 is in turn contained in the p-type substrate 32. When high voltages are applied simultaneously to the both the drain 22 and the gate 10 of cell of FIG. 1, the high voltage across the drain-to-source produces a high channel current and channel field that generate hot electrons in a pinch off region near the drain 22 (as indicated by wedge-shaped region and the notation e-). The high voltage on the control gate 10 couples a voltage to the floating gate 14 that attracts the hot electrons, effectively injecting them into the floating gate (as indicated by the upward-turned arrows adjacent the e-notation).

A technique is known that uses negative substrate biasing of the flash memory cells to overcome some of the disadvantages of conventional CHE. An example of this technique is disclosed in U.S. Pat. No. 5,659,504 issued Aug. 19, 1997 (Bude et al., "Method and Apparatus for Hot Carrier Injection"). The Bude et al. programming technique, which is referred to as channel-initiated secondary electron injection ("CISEI"), uses a positive bias voltage of about 1.1 volts to about 3.3 volts at the drain and a negative bias voltage of about −0.5 volts or more negative at the substrate, with the source at zero volts. The source-drain voltage causes some channel hot electron generation while the substrate bias promotes the generation of a sufficient amount of secondary hot electrons having a sufficient amount of energy to overcome the energy barrier between the substrate and the floating gate. The secondary hot electrons are primarily involved in charging the floating gate. The programming of the flash memory array using CISEI transistors is relatively quickly achieved with low programming current, low drain voltage, and smaller cell size (shorter channel length) relative to flash memory arrays using CHE transistors. However, simultaneous multiple byte programming and page mode programming are still difficult to achieve. Unfortunately, as in the case the CHE memory array, the use of isolating select transistors in CISEI memory cells increases their size, and the technique of repeated programming groups of bits until the desired amount of memory is programmed can cause program-disturb.

Self-aligned double-polysilicon stacked gate structures such as the structure 1 shown in FIG. 1 have been used in various contactless virtual ground configurations to achieve high memory density levels. FIG. 2 is a schematic diagram showing a basic virtual ground array architecture 200 that uses a cross-point array configuration of memory cells interconnected by row lines and column lines. Word lines are shown in FIG. 2 as extending from an X decoder 206 into respective sectors of the array, represented by sectors 210, 211, 212, 213, 214 and 215. One example of a type of row line is the $WSi_2$/Poly control gate word line. Column lines are shown in FIG. 2 as extending between a program column select 204 and a read column select 208, both of which receive a decoded y-address from a Y decoder 202. Column lines are formed in a variety of ways. A column line may be formed of highly conductive material, such as the word line. However, one type of column line in common use in virtual ground arrays is the continuous buried n+ diffusion that forms a sub-bit line of the memory array. Metal (not shown) typically is used to make contact to the buried sub-bit line periodically, for example every sixteenth word line, to reduce bit line resistance. Due to elimination of the common ground line and the drain contact in each memory cell, extremely small cell size is realized. A great many virtual ground array architectures and nonvolatile semiconductor memory devices have been developed, as exemplified by the following patents: U.S. Pat. No. 6,175,519 issued Jan. 16, 2001 to Liu et al.; U.S. Pat. No. 5,959,892 issued Sep. 28, 1999 to Lin et al.; U.S. Pat. No. 5,646,886 issued Jul. 8, 1997 to Brahmbhatt; and U.S. Pat. No. 5,060,195 issued Oct. 22, 1991 to Gill et al.

Programming, erasing and reading of the memory cells in a virtual ground memory array is obtained by the use of suitable source and drain decoding. Several illustrative sectors 210–215 are shown in FIG. 2, each of which typically contains about 512 bytes or 4096 stacked gate transistors, as well as some redundant bytes, but which may contain more or less as desired. Unfortunately, source and drain decoding circuits tend to be extremely complex because of both the need to use a counterbiasing scheme to reduce voltage disturb on cells sharing the same bit line cell and on cells on other word lines, as well as the large number of decoding combinations necessary for a typical sector of memory.

Programming, erasing and reading of the memory cells may be simplified somewhat by the use of asymmetrical floating gate transistors. Examples of one type of asymmetrical floating gate transistor and of a virtual ground memory array incorporating it are disclosed in U.S. Pat. No. 5,418,741, issued May 23, 1995 to Gill. Each shared column line has two junctions for each pair of memory transistors that share the column line. One junction is graded for source regions and the other is graded for drain regions. The deep source regions are graded, i.e. gradually sloped, to minimize programming at the source junction region, while the relatively shallow drain regions are abrupt, i.e. steeply sloped, to improve the injection efficiency of the device. The bit line is formed by the shallow drain region implant, which is an n+ implant. Due to the different junction characteristics of adjacent cells, the programming of one cell is said not to disturb the state of the immediately adjacent cell.

Even with the use of asymmetrical floating gate transistors, the programming of cells in the array using CHE and CISEI requires careful biasing schemes on the bit lines to reduce the disturb voltage on an adjacent cell sharing the same bit line. Generally, CHE programming of a floating gate transistor is achieved by applying high positive voltages on both the control gate and the drain, so that both the vertical and lateral components of the electric field are high enough to make efficient CHE injection. The use of an abrupt drain junction and the higher drain voltage improved the efficiency of electron injection, and the use of thin tunnel oxide and high control gate bias is effective for attracting hot electrons to the floating gate.

Even with these and other improvements, improvements in virtual ground arrays is desirable so that the column selects and schemes used for counter-biasing the bit lines for programming, for reading, or for both programming and reading can be further simplified.

BRIEF SUMMARY OF THE INVENTION

We have developed a type of virtual ground memory array that allows for the iterative use of greatly simplified circuits for programming and reading the memory array, and that also enable less complex counter-biasing schemes to be used on the bit lines, relative to the some conventional virtual ground memory architectures.

The disadvantages described above and other disadvantages are overcome individually or collectively in various embodiments of the present invention. One embodiment of the present invention is a virtual ground nonvolatile semiconductor memory array integrated circuit structure comprising a plurality of nonvolatile memory cells, a plurality of row lines, a plurality of column lines, and an isolation structure. The memory cells are organized in a plurality of rows and columns, the memory cells being disposed in active areas of the integrated circuit. The row lines extend generally parallel to respective rows of the memory cells, and the column lines extend generally parallel to respective columns of the memory cells. The isolation structure is disposed between each of the rows of memory cells and between adjacent columns of the memory cells at regular intervals throughout the memory array for electrically isolating the active areas from one another.

A further embodiment of the present invention is a virtual ground nonvolatile semiconductor memory array integrated circuit structure comprising a semiconductor substrate, a plurality of nonvolatile memory cells, a plurality of row lines, a plurality of column lines, and a continuous lattice-like isolation structure. The memory cells are organized in a plurality of rows and columns, the memory cells being disposed in active areas of the integrated circuit in the semiconductor substrate. The row lines extend generally parallel to respective rows of the memory cells. The column lines extend generally parallel to respective columns of the memory cells, each of the column lines comprising a plurality of sub-bit lines diffused into the substrate and a generally metallic bit line coupled to the sub-bit lines. The isolation structure is disposed in the substrate, with some sections being disposed between each of the rows of memory cells and generally parallel thereto, and other sections being disposed between adjacent sub-bit lines at regular intervals throughout the memory array and generally parallel thereto, for electrically isolating the active areas from one another.

Yet another embodiment of the present invention is a virtual ground nonvolatile semiconductor memory array integrated circuit architecture comprising a plurality of sub-blocks of memory cells, each of the sub-blocks comprising a column of isolated memory cell groups and each of the groups comprising N memory cells; a plurality of program column selectors respectively coupled to equal pluralities of the subblocks; and a plurality of program bias circuits coupled to respective program column selectors. Each of the program column selectors is selectively configurable by a first address segment for operatively connecting the respectively coupled program bias circuit to at least one of the respectively coupled sub-blocks. Moreover, each of the program bias circuits is selectively configurable by a second address segment for performing source-drain decodings for N memory cells.

A further embodiment of the present invention is a virtual ground nonvolatile semiconductor memory array integrated circuit architecture comprising a plurality of sub-blocks of memory cells, each of the sub-blocks comprising a column of isolated memory cell groups and each of the groups comprising N memory cells; and a plurality of read column selectors respectively coupled to the sub-blocks. Each of the read column selectors is selectively configurable by an address segment for performing source-drain decodings for N memory cells.

Yet another embodiment of the present invention is a virtual ground nonvolatile semiconductor memory array comprising a plurality of I/O groups, a plurality of program column selectors respectively coupled to the I/O groups, a plurality of program bias circuits respectively coupled to the program column selectors, and a plurality of read column selectors respectively coupled to the sub-blocks. Each of the I/O groups comprises an equal plurality of sub-blocks, each of the sub-blocks comprising a column of isolated memory cell groups, and each of the groups comprising N memory cells. Each of the program column selectors is selectively configurable by a first address segment for operatively connecting the respectively coupled program bias circuit to only one of the sub-blocks of the respectively coupled I/O group, and each of the program bias circuits is selectively configurable by a second address segment for performing source-drain decodings for programming at least one of N memory cells while biasing others to prevent disturb. Each of the read column selectors is selectively configurable by an address segment for performing source-drain decodings for reading at least one of N memory cells while biasing others to prevent disturb.

BRIEF DESCRIPTION OF THE SEVERAL VIEWS OF THE DRAWINGS

FIG. 12 is a table showing the state (powered, grounded, or floating) of various bit lines in the read Y-select of FIG. 11.

FIG. 14 is a schematic circuit diagram of a component of FIG. 13.

FIG. 15 is a table showing the output state (powered or grounded) of the component shown in FIG. 14.

FIG. 16 is a schematic circuit diagram of another component of FIG. 13.

FIG. 17 is a schematic circuit diagram of another component of FIG. 13.

DETAILED DESCRIPTION OF THE INVENTION, INCLUDING THE BEST MODE

In an array of nonvolatile memory cells, the memory cells of each sector are organized into groups of successive cells associated with respective groups of successive column lines, the groups of memory cells preferably being of the same size and being isolated from one another by a suitable isolation structure, illustratively oxide formed by any suitable process such as trench isolation or grown field oxide isolation. Because of cell group isolation, each group of column lines may be decoded by its own relatively small program column select, which preferably is replicated in essentially identical form for all groups of column lines. While each program column select preferably is used to decode one group of column lines, larger program column selects may be used if desired to decode two or more groups of column lines. Read column selects may decode one or more groups of column lines as desired, with the number of column lines decoded by the read column selects being the same as or different than the number of column lines being decoded by the program column selects, as desired. Counterbiasing is simplified since counterbiasing is not necessary for groups of memory cells that do not contain any selected memory cells.

Figure 3:
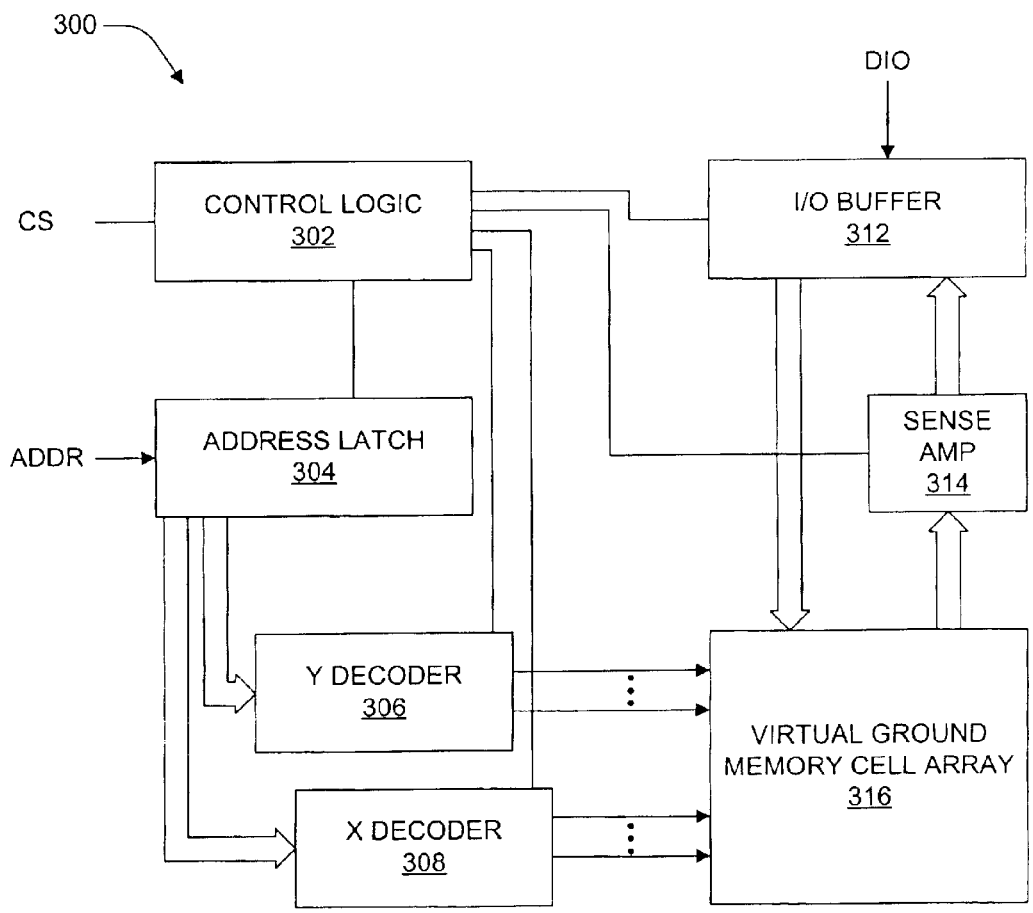
FIG. 3 is a schematic block diagram of a memory that uses a virtual ground nonvolatile memory array having cell group isolation in accordance with the present invention.

FIG. 3 is a schematic block diagram of a memory 300 that uses a virtual ground nonvolatile memory array 316 having cell group isolation. Memory array 316 is combined with various peripheral circuits preferably to create a nonvolatile memory integrated circuit, including address and data buffers, row and column decoders, sense amplifiers, cell-disturb control circuits, high voltage load circuits, over erase protection circuits, programming timer circuits, and on-chip charge pumps. Such peripheral circuits are well known in the art. FIG. 3 is an example of a complete memory that includes control logic 302 having a control signal CS, an address latch 304 having an address signal ADDR, Y decoder 306, X decoder 308, an input/output buffer 312 having a data input/output signal DIO, and a sense amplifier 314.

Figure 4:
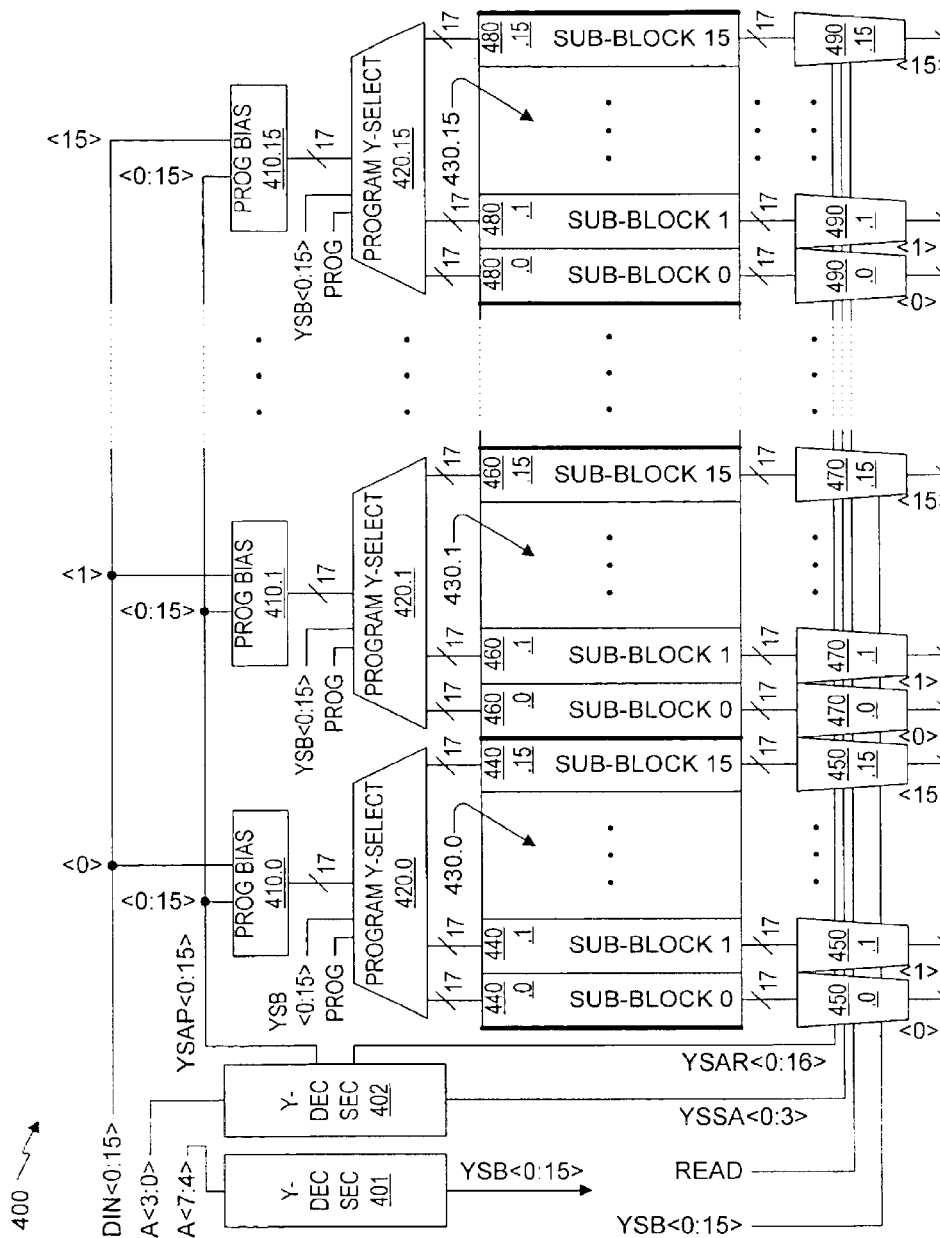
FIG. 4 is a detailed schematic block diagram of an illustrative virtual ground nonvolatile memory array useful in the memory of FIG. 3.

FIG. 4 is a detailed schematic block diagram of an illustrative virtual ground memory array 400 useful in the memory of FIG. 3. The memory cells of the array 400 preferably are organized in rows and columns, each row being accessed by a word line (omitted for clarity) in a manner well known in the art, and the columns being grouped into sub-blocks that are arranged into input/output ("I/O") groups. The actual number of I/O groups and the size of each depends on such factors as the size of the memory and the size desired for the program column selects and the read column selects that one wishes to use for each of the I/O groups. The total memory may be of any convenient size, the sizes 64 Mb, 128 Mb, and 256 Mb being illustrative. As a specific example for purposes of illustration, FIG. 4 shows sixteen I/O groups 430.0–430.15. The I/O group 430.0 is shown with sixteen sub-blocks represented by sub-blocks 440.0–440.15; the I/O group 430.1 is shown with sixteen sub-blocks represented by sub-blocks 460.0–460.15; and the I/O group 430.15 is shown with sixteen sub-blocks represented by sub-blocks 480.0–480.15. Each sub-block contains a column of isolated cell groups, with the size of the groups being related to the size of the simplified circuits used iteratively for programming and reading the memory array. Illustratively, the number of memory cells in each cell group is sixteen, the number of cell groups associated with each set of 17 sub-bit lines is 256, and the number of sets of 17 sub-bit lines is dependent on the memory size. A 64 Mb memory has, for example, 64 sets of sub-bit lines in each column, or 64×256 cell groups.

Each I/O group preferably has a program column select circuit, while each sub-group preferably has a read column select circuit. As illustratively shown in FIG. 4, the I/O group 430.0 has a program column select 420.0, which connects the seventeen column lines of a selected one of the sub-blocks 440.0–440.15 in the I/O group 430.0 to a programming bias circuit 410.0, which places the appropriate voltage levels on the appropriate column lines to program a desired one or more of the memory cells in the selected sub-block of the I/O group 430.0 and to avoid program disturb. Advantageously, the unselected bit lines of the unselected sub-blocks of the I/O group 430.0 may be left floating by the program column select 420.0, and do not suffer any disturb due to their being electrically isolated from the selected sub-block of the I/O group 430.0. The I/O group 430.0 also has sixteen read column selects 450.0–450.15 for the sub-blocks 440.0–440.15 respectively. Each of the read column selects reads one of the memory cells in its respective sub-block and avoids read disturb by placing the appropriate voltage levels on the other column lines of that sub-block. The column lines of the other sub-blocks in the I/O group 430.0 may be left floating. Similarly, the I/O group 430.1 has a programming bias circuit 410.1, a program column select 420.1, sixteen sub-blocks 460.1–460.15, and sixteen read column selects 470.1–470.15; and the I/O group 430.15 has a programming bias circuit 410.15, a program column select 420.15, sixteen sub-blocks 480.1–480.15, and sixteen read column selects 490.1–490.15.

The memory array 400 of FIG. 4 operates as follows to program two bytes of memory. Sixteen bits (two bytes) of data are placed on the data input line DIN<0:15> and are applied respectively to sixteen essentially identical programming bias circuits; for example, bit <0> is applied to programming bias circuit 410.0, bit <1> is applied to programming bias circuit 410.1, and bit <15> is applied to programming bias circuit 410.15. A Y-decoder section 402 decodes Y-address A<3:0> into YSAP<0:15>. YSAR<0:15> is supplied to each of the sixteen programming bias circuits; for example, YSAP<0:15> is supplied to programming bias circuits 410.0, YSAP<0:15> is supplied to programming bias circuits 410.1, and YSAP<0:15> is supplied to programming bias circuit 410.15. The programming bias circuit for each I/O group is selectively connected to one sub-block of the I/O group by the program column select circuit for the I/O group, under control of a programming signal PROG and a selection signal YSB<0:15>. The selection signals YSB<0:15> are decoded from the address A<7:> by the Y-decoder section 401 and applied to the program column select circuits; for example, YSB<0:15> is applied to the program column select 420.0, YSB<0:15> is applied to the program column select 420.1, and YSB<0:15> is applied to the program column select 420.15.

The respective programming bias circuits for the I/O groups perform source and drain decoding for the cell groups selected by the respective program column select circuits for the I/O groups. As shown in FIG. 4, for example, the programming bias circuit 410.0 performs source and drain decoding for any one of the sixteen sub-blocks 440.0–440.15 in the I/O group 430.0, the programming bias circuit 410.1 performs source and drain decoding for any one of the sixteen sub-blocks 460.0–460.15 in the I/O group 430.1, and the programming bias circuit 410.15 performs source and drain decoding for any one of the sixteen sub-blocks 480.0–480.15 in the I/O group 430.15. Preferably, the programming bias circuits and the program column select circuits are replicated in essentially identical form for all of the I/O groups.

The respective read column selects for the I/O groups perform source and drain decoding for the cell groups. As shown in FIG. 4, for example, the read column select 450.0 performs source and drain decoding for the sub-block 440.0, the read column select 450.1 performs source and drain decoding for the sub-block 440.1, and the read column select 450.15 performs source and drain decoding for the sub-block 440.15. Similarly, the read column select 470.0 performs source and drain decoding for the sub-block 460.0, the read column select 470.1 performs source and drain decoding for the sub-block 460.1, and the read column select 470.15 performs source and drain decoding for the sub-block 460.15. Similarly, the read column select 490.0 performs source and drain decoding for the sub-block 480.0, the read column select 490.1 performs source and drain decoding for the sub-block 480.1, and the read column select 490.15 performs source and drain decoding for the sub-block 480.15. Each of the read column selects 450.0–450.15. 470.0–470.15. and 490.0–490.15 receives read control signal READ, selection signals YSB<0:15>, and control signals YSSA<0:3> and YSAR<0:16> which are decoded in the Y decoder section 402 from address bits A<3:0>. Preferably, the read column selects are replicated in essentially identical form for all of the cell groups. Additional read circuits (not shown) include sense amplifiers and counter-biasing circuits.

Figure 5:
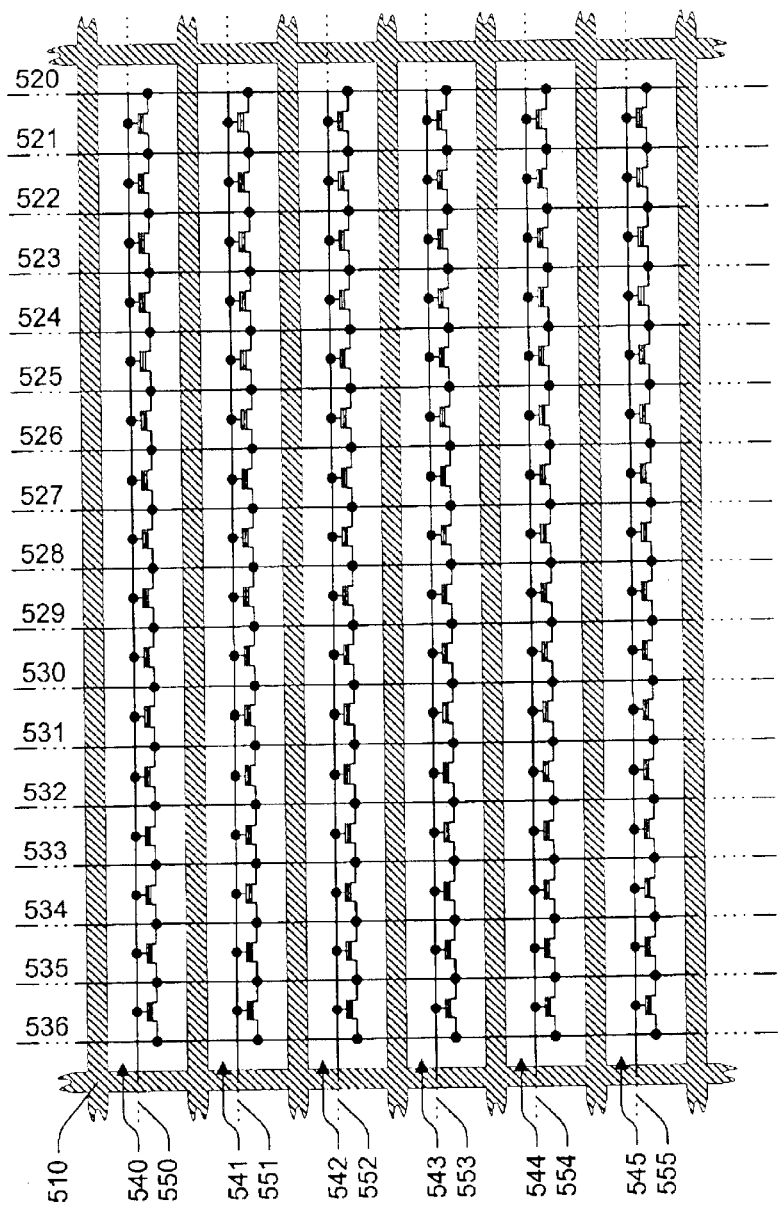
FIG. 5 is a schematic circuit diagram of a column of sub-blocks useful in the virtual ground nonvolatile memory array of FIG. 4, and shows cell group isolation in accordance with the present invention.

FIG. 5 is a schematic circuit diagram of a column of sub-blocks useful in the virtual ground memory array of FIG. 4, and shows cell group isolation in accordance with the present invention. Six representative cell groups 540–545 are shown, each having sixteen memory cells. Any type of memory cell suitable for use in a virtual ground array may be used. The memory cells shown in FIG. 5 are of the stacked gate type, in which programming is performed preferably through channel hot electron ("CHE") injection or channel-initiated secondary electron injection ("CISEI"). Either symmetrical or asymmetrical transistors may be used, as desired. Illustrative program, erase and read techniques are described in U.S. patent application Ser. No. 10/035,414 filed Nov. 8, 2001 (Hsia et al., Method and apparatus for multiple byte or page mode programming and reading of a flash memory array), and in U.S. patent application Ser. No. 10/039,518 filed Nov. 8, 2001 (Han et al., Method and apparatus for multiple byte or page mode programming and reading and for erasing of a flash memory array), which hereby are incorporated herein in their entirety by reference thereto. The memory cells within a group have their control gates connected to a word line; for example, the transistors in the cell group 540 have their control gates connected to word line 550, the transistors in the cell group 541 have their control gates connected to word line 551, the transistors in the cell group 542 have their control gates connected to word line 552, the transistors in the cell group 543 have their control gates connected to word line 553, the transistors in the cell group 544 have their control gates connected to word line 554, and the transistors in the cell group 545 have their control gates connected to word line 555, Each memory cell is connected to two adjacent column lines, which illustratively are either bit lines or sub-bit lines. Seventeen column lines 520–536 are shown.

Figure 6:
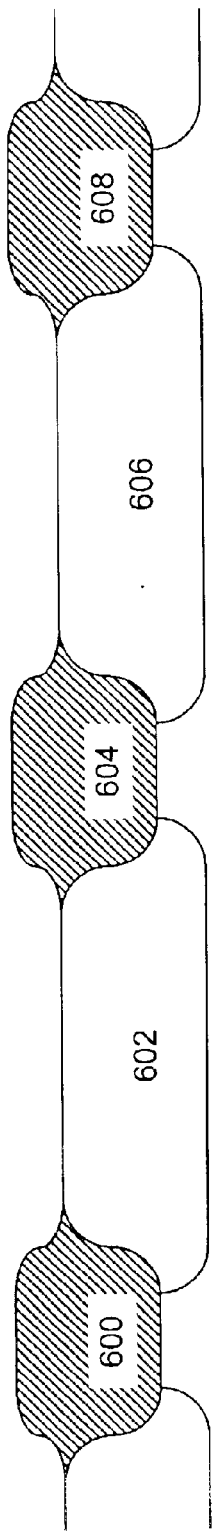
FIG. 6 is a cross-section diagram of a trench isolation structure suitable for providing cell group isolation in the manner shown in FIG. 5.
Figure 7:
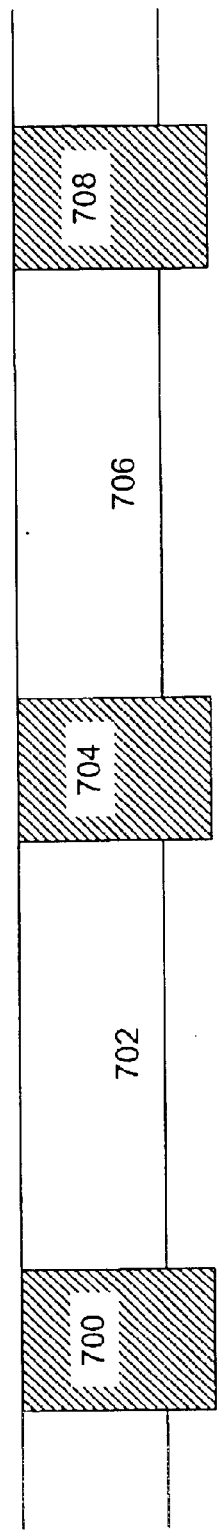
FIG. 7 is a cross-section diagram of a trench isolation structure suitable for providing cell group isolation in the manner shown in FIG. 5.

Each of the cell groups is electrically isolated from adjacent cell groups in both the row and column directions using any suitable isolation structure. The isolation structure 510 shown in FIG. 5 illustratively is a lattice like isolation structure using, for example, trench or field oxide isolation. FIG. 6 is a cross-section diagram of a field oxide isolation structure suitable for providing cell group isolation in the manner shown in FIG. 5; all structural details other than the isolation structure are omitted for the purpose of clarity. Various volumes 602 and 606 of one conductivity type, illustratively n-type, are formed in a substrate of another conductivity type, illustratively p-type, and are isolated from one another by thick thermal oxide sections 600, 604 and 608. FIG. 7 is a cross-section diagram of a trench isolation structure suitable for providing cell group isolation in the manner shown in FIG. 5; all structural details other than the isolation structure are omitted for the purpose of clarity. Various volumes 702 and 706 of one conductivity type, illustratively n-type, are formed in a substrate of another conductivity type, illustratively p-type, and are isolated from one another by oxide-filled trench sections 700, 704 and 708. Since field oxide isolation structures, trench isolation structures, and methods for forming such isolation structures are well know in the art, they need not be described further herein.

In implementations having buried sub-bit lines, the sub-bit lines cross some portions of the isolation structures as shown in FIG. 5, so that suitable fabrication techniques are used to achieve such crossings without sacrificing isolation. One suitable technique is disclosed in U.S. patent application Publication No. U.S. Ser. No. 2002/0041526 published Apr. 11, 2002 (Sugita et al., "Nonvolatile Semiconductor Memory Device, Process of Manufacturing the Same and Method of Operating the Same"), which hereby is incorporated herein in its entirety by reference thereto. Metal bit lines cross over the isolation structure in a manner well known in the art.

Figure 1:
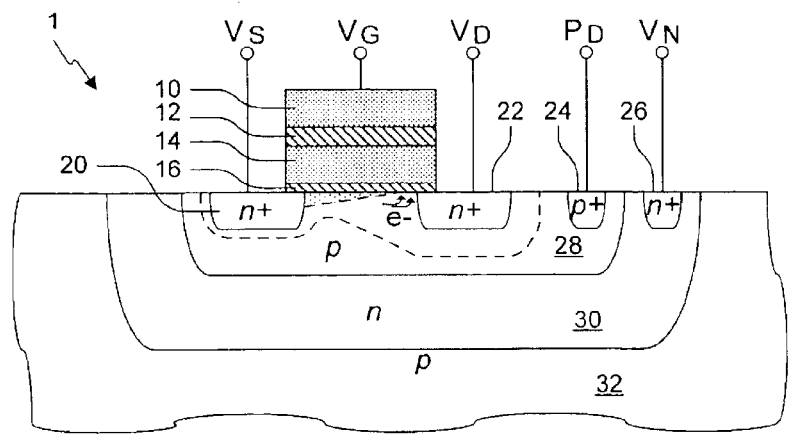
FIG. 1 is a cross-section drawing of a stacked gate memory cell of the prior art.
Figure 2:
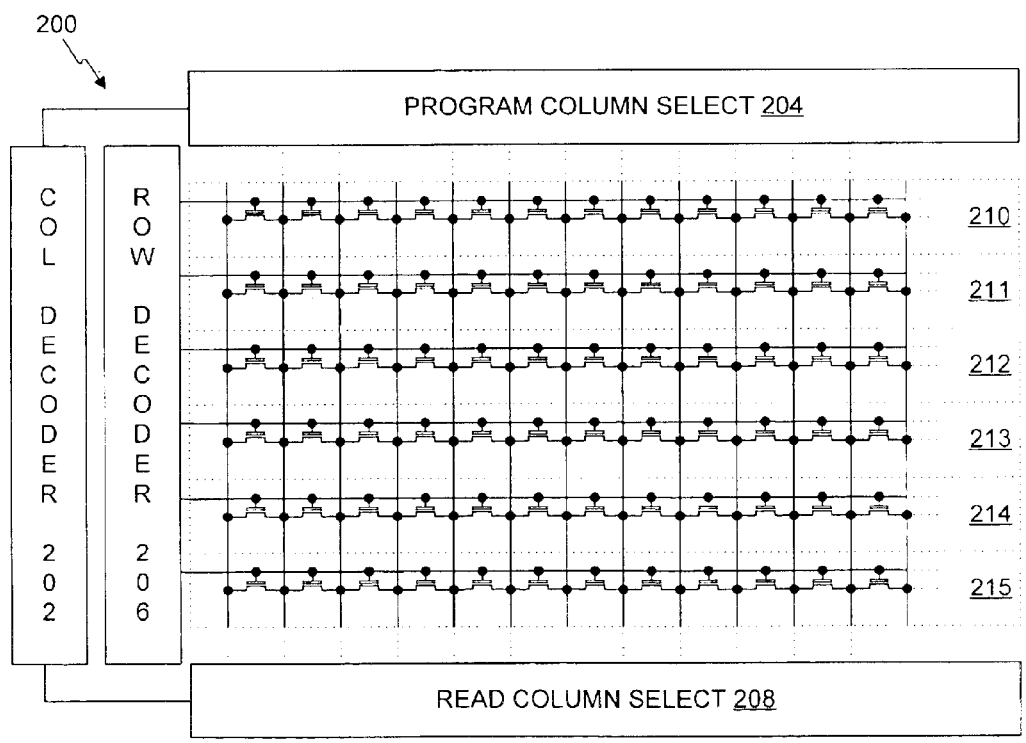
FIG. 2 is a schematic diagram of a virtual ground array of stacked gate memory cells of the prior art.

The number of memory cells within each cell group is selected to achieve a desired balance between the overall size of the memory and the speed of programming and reading. While each cell group 540–545 is shown with sixteen stacked gate transistors, the memory cells may be organized into somewhat smaller or somewhat larger groups as desired. Preferably, the number of memory cells in each cell group is a multiple of eight, but other groupings may be used if desired. Advantageously, groups having these general sizes permit a reduction in complexity in, and facilitate the design of, the programming bias circuits and the program and read column select circuits, so that the total amount of integrated circuit area taken up by all of the small decoders is significantly less than the integrated circuit area required by a single large decoder. While some of this advantage is lost in the amount of area taken up by the isolation structure, overall the area of the memory integrated circuit using the FIG. 5 arrangement and the area using the prior art arrangement of FIG. 2 can be made comparable. Advantageously, the number of bits that can be programmed and read at one time can be increased without changing the group size by adding more I/O groups, up to the power capacity of the memory. Moreover, with some increase in complexity of the program column select circuits, multiple memory cells in a sub-block may be programmed. Similarly, with some increase in complexity of the program column select circuits, multiple memory cells in a sub-block may be read. The number of simultaneously programmed cells may be different that the number of simultaneously read cells. Accordingly, the optimal cell group size, the number of simultaneously programmed and/or read, and the overall memory size are variable depending on the objectives of the designer.

The isolation structure functions as follows for program, read and erase cycles. At any given time, one or more memory cells within a cell group are being programmed, read, or erased, with appropriate biasing and counterbiasing being placed on all of the bit lines for the cell group. Other cell groups in the same row may also be programmed, read or erased at the same time, with appropriate biasing and counterbiasing being placed on all of their bit lines as well. Advantageously, other cell groups in the same row that are not having any of their bits programmed, read or erased (the "unselected" groups) need not have their bit lines biased or counterbiased, since they are isolated from currents and voltages of the cell groups that are having their bits programmed or read (the "selected" groups). Isolation parallel to the bit lines completely isolates the last bit line of one group from the first bit line of another group, thereby preventing leakage between the bitlines. The bit lines of the unselected groups may be allowed to float, which eliminates the need to provide biasing and counterbiasing circuitry for them, thereby greatly simplifying the design and reducing the size of these circuits. Isolation parallel to the word lines isolates the unselected rows from the selected row. Sensing is improved without the need to counterbias the unselected rows because leakage currents from the unselected cells cannot contribute.

Figure 8:
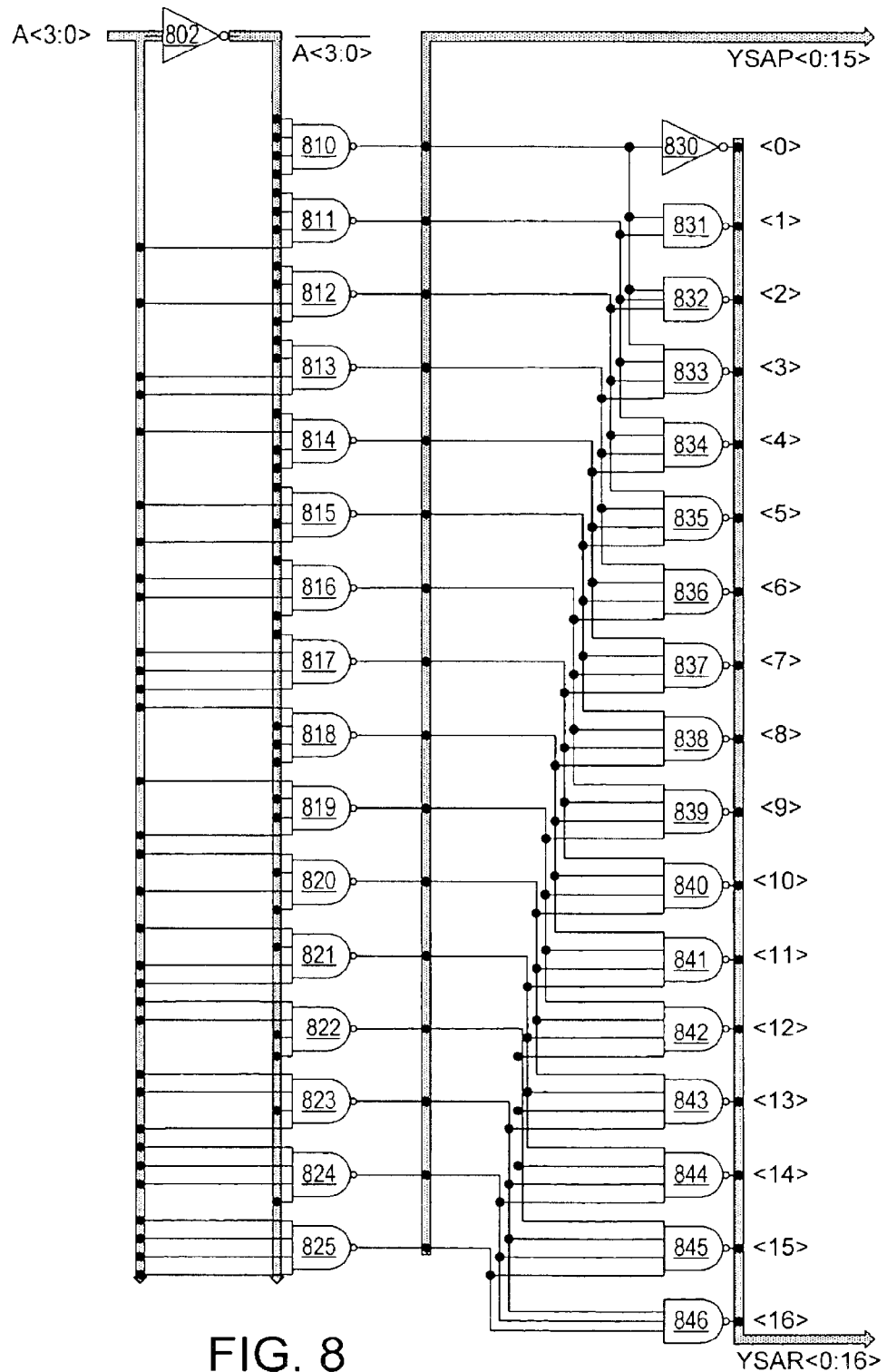
FIG. 8 is a schematic circuit diagram of one portion of a Y decoder suitable for use with the virtual ground memory array of FIG. 4.

FIG. 8 is a schematic circuit diagram of a Y decoder circuit that is suitable for use in the Y-decoder section 402 in the virtual ground memory array of FIG. 4. A portion A<3:0> of an address is inverted by an inverter 802, and the original and inverted address bits are variously applied to one or more of the inputs of sixteen 4-input NAND gates 810–825. The sixteen outputs of the NAND gates 810–825 are supplied as the signal YSAP<0:15>, and also are variously applied to one or more of the inputs of an inverter gate 830 and NAND gates 831–846. The seventeen outputs of the gates 830–846 are supplied as the seventeen control signals YSAR<0:16>. The arrangement of NAND gates 810–825 and gates 830–846 map the various cell addresses 0:15 to the control signals YSAR<0:16> as shown in the table of FIG. 10.

Figures 9, 10:
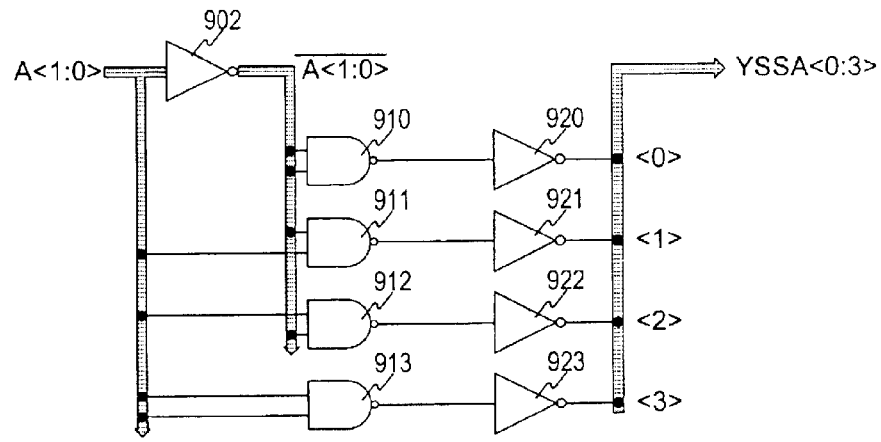
FIG. 9 is a schematic circuit diagram of another portion of a Y decoder suitable for use with the virtual ground memory array of FIG. 4.
FIG. 10 is a table showing the state (powered, grounded, or floating) of various circuit lines YSAR and YSSA used to access particular memory cells.

FIG. 9 is a schematic circuit diagram of a Y decoder circuit that is also suitable for use in the Y-decoder section 402 in the virtual ground memory array of FIG. 4 along with the circuit of FIG. 8. A portion A<1:0> of the address is inverted by an inverter 902 to provide inverted address bits A<1:0> bar, and the original and inverted address bits are variously applied to one or more of the inputs of four 2-input NAND gates 910–913. The outputs of the NAND gates 910–913 are applied to respective inverters 920–923, which supply four control signals YSSA<0:3>. The arrangement of NAND gates 910–913 and inverters 920–923 map the various cell addresses 0:15 to the control signals YSSA<0:3> as shown in the table of FIG. 10.

Figure 11:
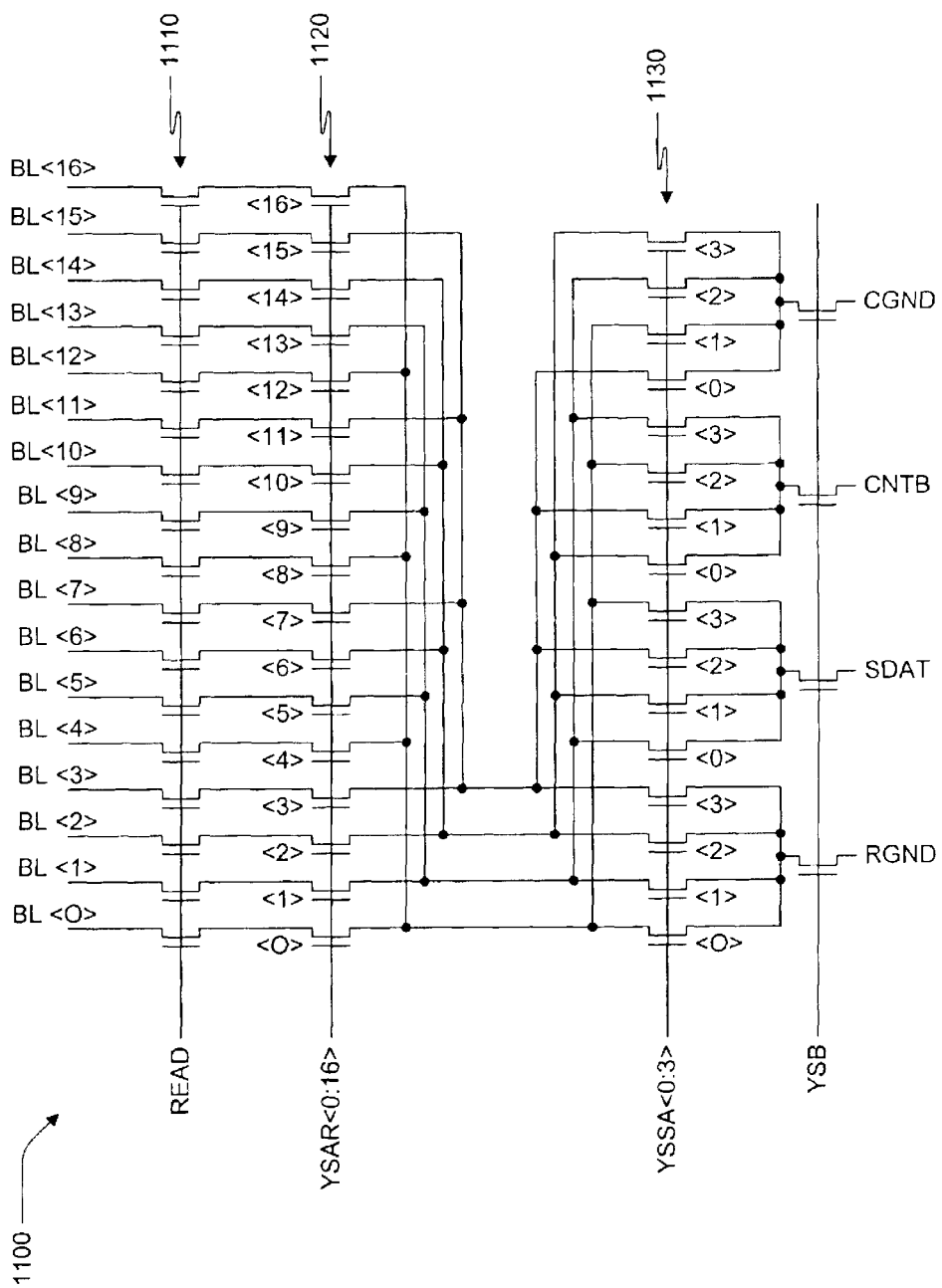
FIG. 11 is a schematic circuit diagram showing a read Y-select useful in reading the virtual ground memory array of FIG. 4.

FIG. 11 is a schematic circuit diagram showing a read column select circuit 1100 useful in reading the virtual ground memory array of FIG. 4. The read column select circuit 1100 performs source and drain decoding for bit lines BL<0:16>, which are from a sub-block. A row 1110 of seventeen transistor switches are turned ON by the read control signal READ to access the bit lines BL<0:16>. A row 1120 of transistor switches selects four successive bit lines for each cell to be read, the particular selection depending on the value of YSAR<0:16>. A row 1130 of sixteen transistor switches selects one line for the cell being read to which a read ground RGND is applied, another line for the cell being read to which a data read voltage SDAT is applied, one line for a neighboring cell to which a counter bias voltage CNTB is applied, and another line for the neighboring cell to which a counter bias ground CGND is applied.

An example of how the read column select circuit 1100 operates is as follows. If one wishes to read a memory cell, say the cell lying between bit line BL<0> and BL<1> (cell #0 in FIG. 10) for example, the read control signal READ is HIGH to turn ON all transistors in row 1110, and lines YSSA<0:3> are HIGH to turn ON the first four transistors in row 1120. Lines YSSA<4:15> are floating or grounded as desired so that the rest of the transistors in row 1120 are OFF. As seen in FIG. 10, lines YSSA<0:3> are at 1000 respectively so that RGND is applied to BL<0> and SDAT is applied to BL<1> to read the desired memory cell. At the same time, CNTB is applied to BL<2> and CGND is applied to BL<3> to prevent read disturb. FIG. 12 is a table that shows the bit line voltage scheme corresponding to the YSAR and YSSA control signals shown in FIG. 10, by which the various cell numbers (CELL #) 0:15 are mapped to the bit lines (BL) 0:16.

Any suitable circuits may subsequently be used to sense the values stored in the memory cells. Examples of suitable circuits are disclosed in U.S. patent application Publication No. U.S. Ser. No. 2002/0012280 published Jan. 31, 2002 (Yamamoto et al., Nonvolatile Semiconductor Storage Device), which hereby is incorporated herein in its entirety by reference thereto.

Figure 13:
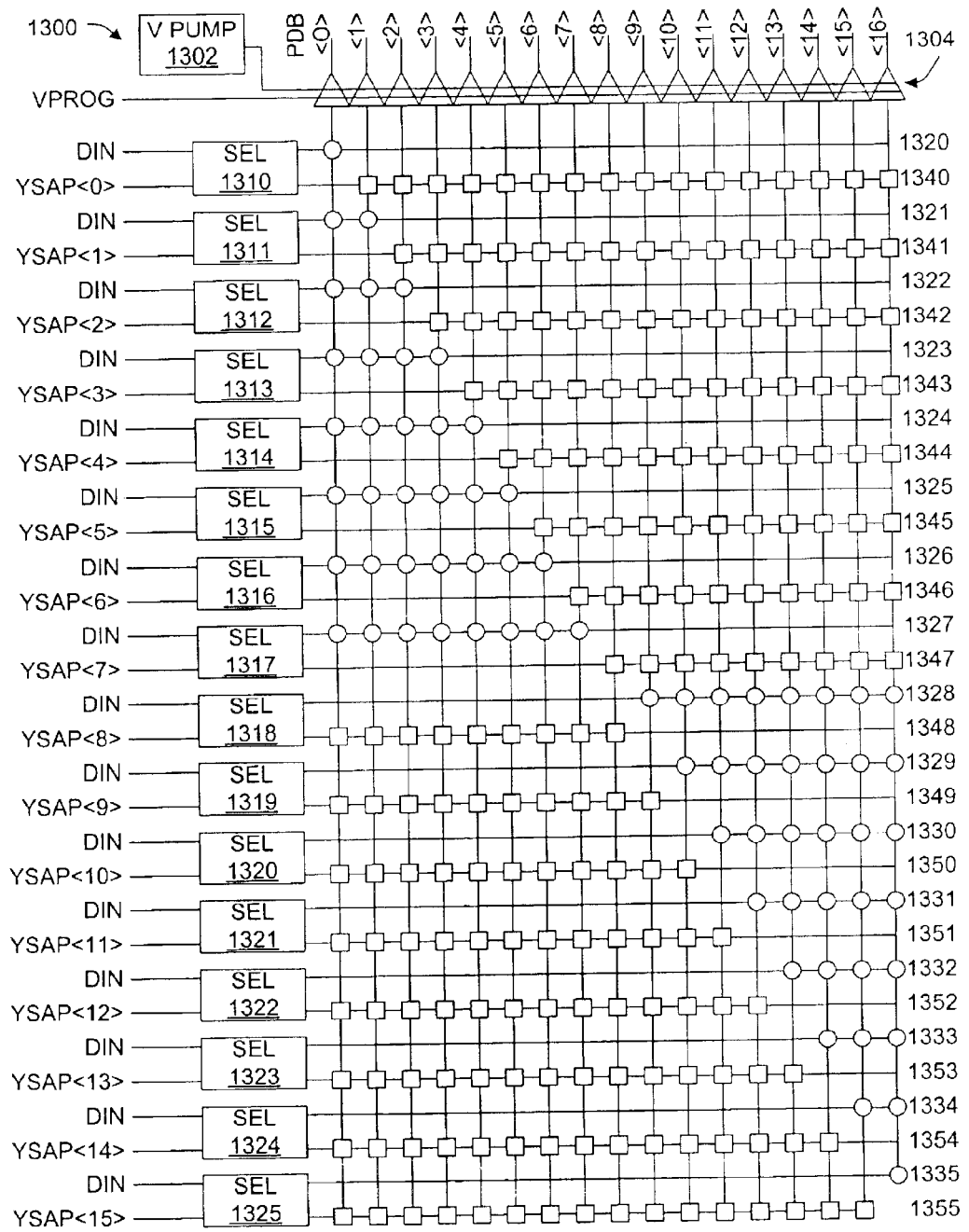
FIG. 13 is a schematic circuit diagram showing a program biasing circuit useful in programming the virtual ground memory array of FIG. 4.
Figure 18:
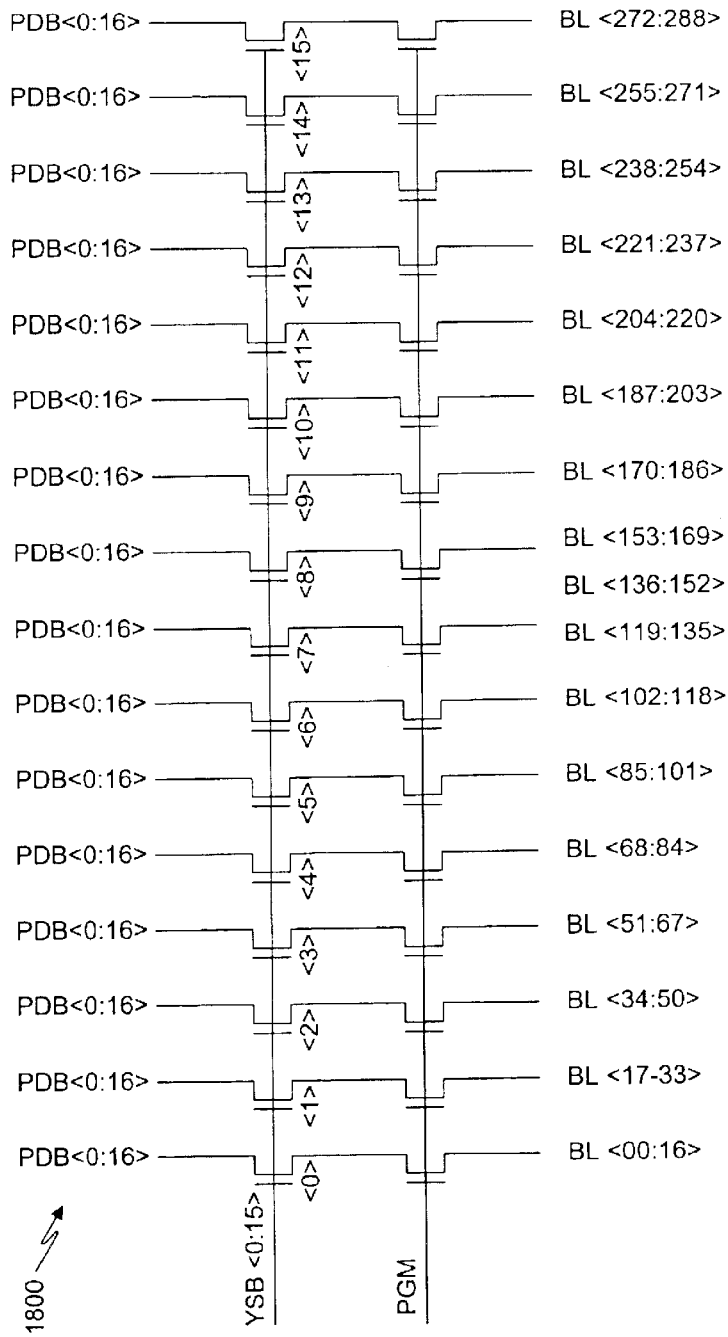
FIG. 18 is a schematic circuit diagram showing a program Y-select circuit useful in programming the virtual ground memory array of FIG. 4.

FIG. 13 is a schematic circuit diagram showing an illustrative implementation of a portion 1300 of a program bias circuit useful in programming the virtual ground memory array of FIG. 4. The portion 1300 includes seventeen voltage drivers 1304, which receive high programming voltages from a voltage pump 1302 and which are controlled by the program control signal VPROG and provide respective outputs PDB<0:16>. Suitable voltage drivers and voltage pumps are well known in the art. Any suitable circuit may be used to connect the outputs PDB0:<16> to the respective 17 column lines of a selected sub-block. One such circuit, which is shown in FIG. 18, is a simple multiplexer 1800 having two rows of transistor switches. In one row, the selection control lines YSB<0:15> control respective groups of 17 transistors that controllably connect the lines PDB<0:16> to an appropriate set of bit lines for the selected sub-block. The other row of transistors is operated by a programming control signal PGM. If one desires to connect the lines PDB<0:16> to the bit lines BL<17:33> of the second sub-block, for example, the lines YSB<0> and YSB<2:15> are at 0 and the line YSB<1> is at 1. The seventeen transistors between the lines PDB<0:16> and the bit lines BL<17:33>, which are represented in FIG. 18 by a single transistor symbol at YSB<1>, become conductive to make the operative connection while the other transistors controlled by YSB<0> and YSB<2:15> remain nonconductive.

The sixteen lines YSAP<0:15> of the decoded Y-address are supplied to respective select circuits 1310–1325. FIG. 14 shows a logic circuit 1400 suitable for use as the select circuits 1310–1325. The logic circuit 1400 has an inverter 1402, a two-input NAND gate 1404, and an inverter 1406. The data input signal DIN<#> for the particular I/O stage # is applied to the inverter 1402. One of the sixteen lines YSAP<0:15> is applied to the NAND gate 1404, along with the output of the inverter 1402. The output of the NAND gate 1404 is supplied as a gate control voltage OVCC, and is also supplied as an input to the inverter 1406. The output of the inverter 1406 is supplied as a gate control voltage OGND.

The circuit 1400 implements the logic for realizing the outputs OVCC and OGND from the inputs DIN and YSAP as shown in the table of FIG. 15. Specifically, the portion 1300 of the program Y-select circuit performs programming when DIN<#> and YSAP<#> are 0 and 1, the outputs OVCC and OGND being 0 and 1 respectively. No programming is performed when DIN<#> and YSAP<#> are 0 and 0, 1 and 1, and 1 and 0 (the outputs OVCC and OGND being 1 and 0 respectively). In the table of FIG. 15, a "1" represents VCC and a "0" represents VGND.

Each of the select circuits 1310–1325 controls two rows of transistor switches. One row of transistor switches contains one or more transistors referred to herein as VCC transistors which are controlled by the OVCC output of the select circuit and which, when ON, furnish VCC to the input of respective ones of the voltage drivers 1304. VCC transistors are represented by an open circle in FIG. 13, and an example of a suitable VCC transistor, a PMOS transistor 1600, is shown in FIG. 16. Rows 1320–1335 are rows of one or more VCC transistors. The other row of transistor switches controlled by the OGND output of the select circuit contains one or more transistors referred to herein as VGND transistors. When ON, the VGND transistors furnish VGND to the input of respective ones of the voltage drivers 1304. VGND transistors are represented by an open square in FIG. 13, and an example of a suitable VGND transistor, an NMOS transistor 1700, is shown in FIG. 17. Rows 1340–1355 are rows of one or more VGND transistors. As a specific example, consider the outputs of the select circuit 1310. The OVCC output controls one VCC transistor in the row 1120, which in turn controls the voltage driver for line PDB<0>. The OGND output controls sixteen VGND transistors in the row 1160, which in turn respectively control the voltage drivers for lines PDB<1:16>.

An example of how the program column select circuit 1300 operates is as follows. Assume that one wishes to program memory cell at address A<3:0>=0001 which resides between bit line BL<1> and BL<2>. The data input DIN is at 0 to indicate program data. The address is decoded by NAND gates 810–825 (see FIG. 8) such that YSAP<0> and YSAP<2:15> are 0 while YSAP<1> is 1. As can be seen in the table of FIG. 15, a 0 value for YSAP forces a "no programming" condition wherein OVCC and OGND are 1 and 0 respectively, regardless of the value of DIN. Accordingly, the VCC transistors in the rows 1320 and 1322–1335 are OFF and the VGND transistors in the rows 1340 and 1342–1355 are OFF, thereby leaving the inputs of the voltage drivers 1304 floating. However, DIN and YSAP are 0 and 1 respectively at the input of the select circuit 1311, causing OVCC and OGND at the output of the select circuit 1311 to be 0 and 1 respectively. These outputs turn ON the VCC transistors in the row 1321 and the VGND transistors in the row 1341, which cause the voltage drivers 1304 to drive a programming voltage on lines PDB<0:1> and ground voltage on lines PDB<2:16>. This is an appropriate condition for programming the memory cell residing between bit line BL<1> and BL<2> without disturbing adjacent memory cells.

Various circuit designs, device designs, and fabrication processes are known for manufacturing the semiconductor memory of FIG. 3 and variations thereof. It will be appreciated that specific circuits, transistor types and the materials, dimensions, doping concentrations, doses, energy levels, temperatures, drive-in times, ambient conditions, and all other values for the parameters of these processes may well be selected as a matter of design choice or to achieve desired characteristics, as would be understood by one of ordinary skill in the art. As these devices and processes are not specific to the fabrication of the semiconductor memory and are in any event well known in the art, they are not further described herein. Some examples are disclosed in the aforementioned patent application publications of Sugita et al. and Yamamoto et al., as well as in U.S. patent application Publication No. U.S. Ser. No. 2001/0050861 published Dec. 13, 2001 (Yamauchi et al., "Nonvolatile Semiconductor Storage Device and Test Method Therefor"), which hereby are incorporated herein in their entirety by reference thereto.

The description of the invention and its applications as set forth herein is illustrative and is not intended to limit the scope of the invention. Variations and modifications of the embodiments disclosed herein are possible, and practical alternatives to and equivalents of the various elements of the embodiments are known to those of ordinary skill in the art. For example, the terms "row line" and "column line" are used for convenience to refer to lines that typically are orthogonal to one another and typically are used as word select lines and bit and sub-bit lines respectively, but should be understood in their more broad sense as pairs of lines used to access individual memory cells for purposes of programming, erasing and reading. The term "sector" used herein typically but not necessarily corresponds to a page. The term "nonvolatile memory cell" refers to a variety of different types of nonvolatile semiconductor memory, including floating gate single transistor cells that use Fowler-Nordheim tunneling for both programming and erasing, or that use hot electrons and Fowler-Nordheim tunneling for programming and erasing respectively. The various components such as multiplexers, bias circuits, line drivers, and voltage pumps described herein may be implemented in a variety of ways, such implementations being well known in the art. These and other variations and modifications of the embodiments disclosed herein may be made without departing from the scope and spirit of the invention.

What is claimed is:

1. A virtual ground nonvolatile semiconductor memory array integrated circuit structure comprising:
   a plurality of nonvolatile memory cells organized in a plurality of rows and columns, the memory cells being disposed in active areas of the integrated circuit;
   a plurality of row lines extending generally parallel to respective rows of the memory cells;
   a plurality of column lines extending generally parallel to respective columns of the memory cells; and
   an isolation structure disposed between each of the rows of memory cells and between adjacent columns of the memory cells at regular intervals throughout the memory array for electrically isolating the active areas from one another.

2. The memory array of claim 1 wherein the memory cells are single transistor floating gate cells suitable for programming by hot electrons, the floating gate transistors being organized in groups of equal size and the isolation structure having sections thereof disposed between adjacent ones of the groups.

3. The memory array of claim 2 wherein the group size is 8 transistors.

4. The memory array of claim 2 wherein the group size is 16 transistors.

5. The memory array of claim 2 wherein the group size is 24 transistors.

6. The memory array of claim 1 wherein adjacent column lines of adjacent groups are electrically isolated from one another by sections of the isolation structure that are substantially parallel thereto.

7. The memory array of claim 1 wherein each of the column lines comprises a bit line coupled to a plurality of buried sub-bit lines, wherein adjacent buried sub-bit lines of adjacent groups are electrically isolated from one another by sections of the isolation structure that are substantially parallel thereto.

8. The memory array of claim 1 wherein the isolation structure is a trench isolation structure.

9. The memory array of claim 1 wherein the isolation structure is a field oxide isolation structure.

10. A virtual ground nonvolatile semiconductor memory array integrated circuit structure comprising:
    a semiconductor substrate;
    a plurality of nonvolatile memory cells organized in a plurality of rows and columns, the memory cells being disposed in active areas of the integrated circuit in the semiconductor substrate;
    a plurality of row lines extending generally parallel to respective rows of the memory cells;
    a plurality of column lines extending generally parallel to respective columns of the memory cells, each of the column lines comprising a plurality of sub-bit lines diffused into the substrate and a generally metallic bit line coupled to the sub-bit lines; and
    a continuous lattice-like isolation structure disposed in the substrate, first sections of the isolation structure being disposed between each of the rows of memory cells and generally parallel thereto, and second sections of the isolation structure between disposed adjacent sub-bit lines at regular intervals throughout the memory array and generally parallel thereto, for electrically isolating the active areas from one another.

11. The memory array of claim 10 wherein the isolation structure is a trench isolation structure.

12. The memory array of claim 10 wherein the isolation structure is a field oxide isolation structure.

13. A virtual ground nonvolatile semiconductor memory array integrated circuit architecture comprising:
    a plurality of sub-blocks of memory cells, each of the sub-blocks comprising a column of isolated memory cell groups and each of the groups comprising N memory cells;
    a plurality of program column selectors respectively coupled to equal pluralities of the sub-blocks; and
    a plurality of program bias circuits coupled to respective program column selectors;
    wherein each of the program column selectors is selectively configurable by a first address segment for operatively connecting the respectively coupled program bias circuit to at least one of the respectively coupled sub-blocks; and
    wherein each of the program bias circuits is selectively configurable by a second address segment for performing source-drain decodings for N memory cells.

14. The memory array of claim 13 wherein each of the memory cell groups is isolated from adjacent memory cell groups by a trench isolation structure.

15. The memory array of claim 13 wherein each of the memory cell groups is isolated from adjacent memory cell groups by a field oxide isolation structure.

16. A virtual ground nonvolatile semiconductor memory array integrated circuit architecture comprising:
    a plurality of sub-blocks of memory cells, each of the sub-blocks comprising a column of isolated memory cell groups and each of the groups comprising N memory cells; and
    a plurality of read column selectors respectively coupled to the sub-blocks;
    wherein each of the read column selectors is selectively configurable by an address segment for performing source-drain decodings for N memory cells.

17. The memory array of claim 16 wherein each of the memory cell groups is isolated from adjacent memory cell groups by a trench isolation structure.

18. The memory array of claim 16 wherein each of the memory cell groups is isolated from adjacent memory cell groups by a field oxide isolation structure.

19. A virtual ground nonvolatile semiconductor memory array comprising:
    a plurality of I/O groups, each comprising an equal plurality of sub-blocks, each of the sub-blocks comprising a column of isolated memory cell groups, and each of the groups comprising N memory cells;
    a plurality of program column selectors respectively coupled to the I/O groups;
    a plurality of program bias circuits respectively coupled to the program column selectors, wherein each of the program column selectors is selectively configurable by a first address segment for operatively connecting the respectively coupled program bias circuit to only one of the sub-blocks of the respectively coupled I/O group, and wherein each of the program bias circuits is selectively configurable by a second address segment for performing source-drain decodings for programming at least one of N memory cells while biasing others to prevent disturb; and a plurality of read column selectors respectively coupled to the sub-blocks, wherein each of the read column selectors is selectively configurable by an address segment for performing source-drain decodings for reading at least one of N memory cells while biasing others to prevent disturb.

* * * * *